United States Patent [19]

Georgopoulos

[11] 3,974,403
[45] Aug. 10, 1976

[54] DIGITAL DATA TRANSMISSION SYSTEM

[75] Inventor: Christos J. Georgopoulos, Lowell, Mass.

[73] Assignee: Raytheon Company, Lexington, Mass.

[22] Filed: Nov. 11, 1974

[21] Appl. No.: 522,384

Related U.S. Application Data

[63] Continuation of Ser. No. 267,748, June 30, 1972, abandoned.

[52] U.S. Cl. .............................. 307/270; 307/208; 307/246; 307/263; 307/268; 317/33 C; 340/248 R
[51] Int. Cl.² ........................................ H03K 3/53
[58] Field of Search .......... 307/208, 246, 254, 263, 307/268, 270, 237

[56] References Cited
UNITED STATES PATENTS 3,176,158   3/1965   Guignard ........................... 307/293
3,573,504   4/1971   Breuer .............................. 307/270
3,723,761   3/1973   Masaki .............................. 307/208

OTHER PUBLICATIONS

Millman and Taub, *Pulse, Digital, and Switching Waveforms*, McGraw–Hill, N.Y., 1965, pp. 23–25 and 166–167.

*Primary Examiner*—William D. Larkins
*Attorney, Agent, or Firm*—Richard M. Sharkansky; Philip J. McFarland; Joseph D. Pannone

[57] ABSTRACT

A driver circuit for a digital data transmission system is provided with a transistor current limiting network, the network being bypassed by a capacitor. The network is selectively supplied with a disabling signal via another transistor to disconnect the driver circuit from its power supply in the event of a short circuit condition.

2 Claims, 2 Drawing Figures

DIGITAL DATA TRANSMISSION SYSTEM

The invention herein described was made in the course of or under a contract or subcontract thereunder, with the Department of Defense.

CROSS-REFERENCE TO RELATED CASES

This is a continuation of application Ser. No. 267,748, filed June 30, 1972, now abandoned.

BACKGROUND OF THE INVENTION

This invention relates generally to digital data transmission systems and more particularly to such systems wherein a transmission line is used to interconnect a plurality of modular subsystems, each one thereof having an associated input/output device arranged in what is commonly called a "party-line" organized system.

As is known in the art, digital data transmission systems sometimes include a plurality of modular subsystems, interconnected by a transmission line, which transfer binary data from one such subsystem to a selected number of other ones therof.

Each one of such modular subsystems generally includes an input/output device incorporating a transmit section and a receive section. The transmit section is connected to the transmission line through a driver circuit which generally includes an output transistor interposed between such transmission line and a voltage source. Such a transistor is responsive to binary control signals for coupling or decoupling the voltage source and transmission line in accordance with the binary control signals. The driver circuit is connected to the transmission line in what is commonly called a "wired-OR" arrangement, that is, a binary "1" (or "high" voltage) produced at the output of any one of the driver circuits will apply a binary "1" signal on the transmission line. Thus, if a short circuit occurs to the output transistor in any one of the driver circuits an erroneous signal (i.e., a "1") is applied to the transmission line. For proper operation of the digital data transmission system as a whole, it is necessary to remove any faulty driver circuit from the transmission line.

Because of the amount of current flow in each driver circuit conventional logic gates cannot be interposed between the output transistor and the transmission line to disable any faulty driver circuit. It has been necessary, therefore, sequentially to manually disconnect each one of the modular subsystems to identify any faulty driver circuit. Such procedure is obviously costly and time consuming on the system.

The driver circuit used in the input/output device of the type described above generally includes protective means operative if a short circuit occurs in the transmission line because such short circuit ordinarily results in excessive, and damaging, current flow through the output transistor of such driver circuit. One known protective means limits the amount of current flow through the output transistor of a driver circuit. Such means include a transistor network disposed between the voltage supply and such output transistor. The use of such a transistor network however, reduces the overall switching response time of the driver circuit, with the concomitant disadvantage of reducing the speed of the digital data transmission system.

An additional problem with digital data transmission systems of the type described above is that of "noise immunity." That is, because the receive sections of the input/output devices are generally connected to the transmission line through relatively low impedance logic gates, such receive sections draw current, even when not selected, thereby causing a relatively large voltage to be developed across the transmission line when a binary "0" (or low voltage) is transmitted thereon. Such relatively large voltage, together with any noise which may be coupled into such transmission line, thereby produces a signal on such transmission line which may appear as a binary "1" instead of a binary "0" to the receive section of a selected input/output device. Therefore, noise immunity protection is generally required to eliminate ambiguity in the binary signal developed across the transmission line. Known "noise immunity" protection techniques generally include the use of a network between the transmission line and each one of the receive sections. Such a network requires a voltage source of opposite polarity from that which is used with the driver circuit. The network and additional voltage source add to the cost of the digital data transmission system.

SUMMARY OF THE INVENTION

With this background of the invention in mind it is therefore an objective of this invention to provide an improved digital data transmission system wherein a transmission line is used to interconnect a plurality of modular subsystems having associated input/output devices.

It is a further object of the invention to provide an improved driver circuit wherein a transistor network is interposed between an output transistor and a voltage source, such driver circuit being faster than any such driver circuit known heretofore.

It is a further object of the invention to provide a digital data transmission system adapted to remove a faulty driver circuit from such system in a faster and less costly manner than has been known heretofore.

It is a further object of the invention to provide an improved noise immunity mechanism for use with a digital data transmission system.

These and other objects of the invention are attained generally by providing in a digital data transmission system wherein a plurality of input/output devices are interconnected through a transmission line, a driver circuit for each one of the input/output devices, such circuit having a first electrical circuit including a voltage source, a drive transistor and a capacitor and a second electrical circuit including the transmission line, an output transistor and the capacitor, such output transistor coupling the voltage source to the transmission line in response to binary signals. The capacitor is common to both the first and the second electrical circuits and arranged such that the capacitor charges when the voltage supply is decoupled from the transmission line and discharges when the voltage supply is coupled to the transmission line. The capacitor stores a voltage for initiating the turning "on" (or "coupling") response of the output transistor to the binary signal and also acts as a sink for minority carriers in turning "off" (or "decoupling") such output transistor.

Means, including an electronic switch, disposed between the base electrode of the driver transistor and the voltage source, is described for automatically disconnecting each one of the plurality of input/output devices from the transmission line at mutually exclusive times and for indicating which one, or ones, of such devices may have a short circuited output transistor.

In one embodiment a noise immunity technique is provided wherein a transistor, biased in its inverted mode of operation, is disposed to shunt a matching impedance connected across the transmission line.

BRIEF DESCRIPTION OF THE DRAWINGS

The foregoing features of this invention, as well as the invention itself, may be more fully understood from the following detailed description read together with the accompanying drawings, in which.

DESCRIPTION OF THE PREFERRED EMBODIMENTS

Figure 1:
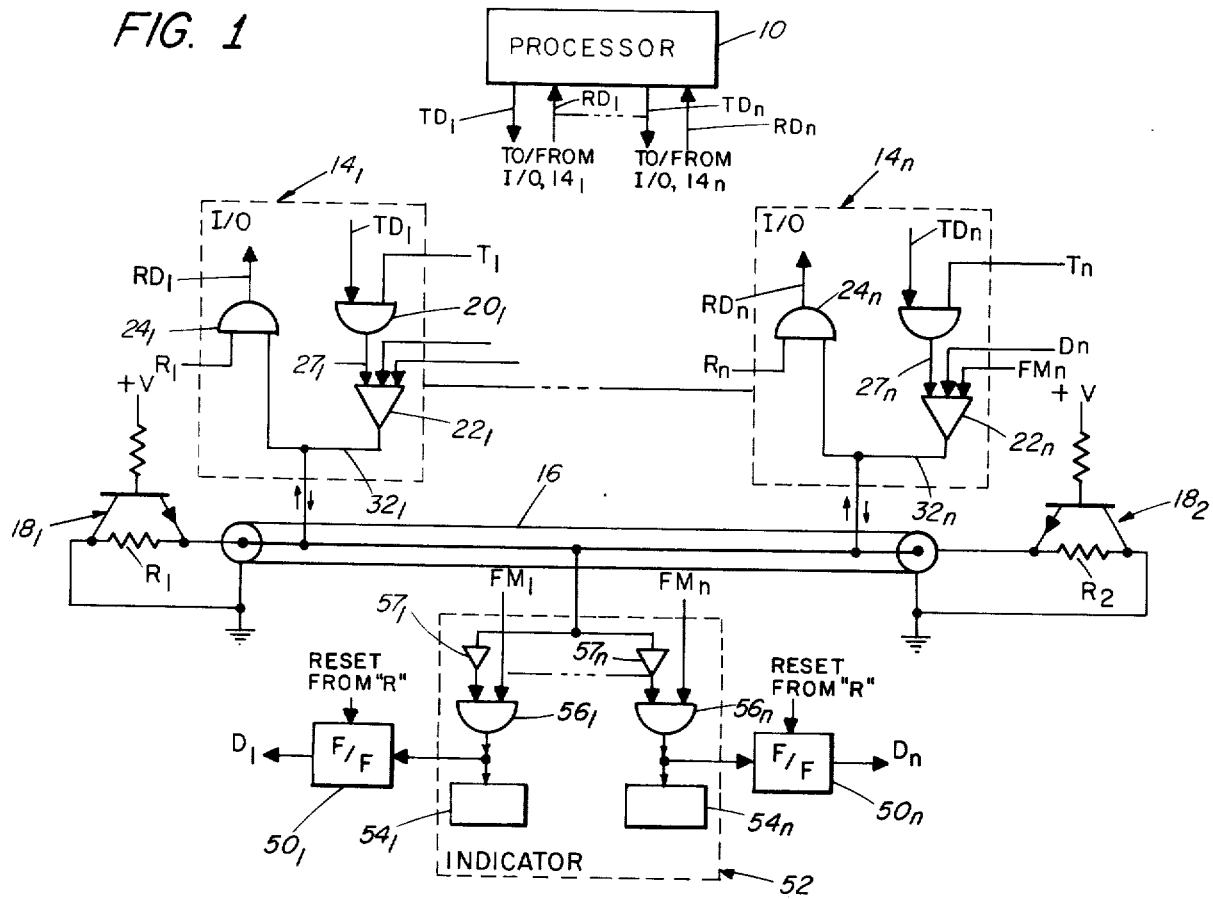
FIG. 1 is a diagram of a digital data transmission system employing the features of the invention.

Referring now to FIG. 1, binary data is transferred between a plurality of modular subsystems (not shown but here contained within a processor 10) when a controller 12 applies binary control signals to selected ones of $n$ identical input/output devices $14_1 - 14n$. The input/output devices $14_1 - 14n$ are interconnected through transmission line 16. The operation of each one of the input/output devices 14– 14n is determined by the controller 12 selectively actuating a receiver enable line $R_1 - R_n$, a transmit enable line $T_1 - T_n$, or a failure monitoring line $FM_1 - FM_n$. Each one of the input/output devices $14_1 - 14_n$ is connected to each modular subsystem of processor 10 by a different transmit data line $TD_1 - TD_n$, respectively, and a different receive data line $RD_1 - RD_n$, respectively, as shown. Transmission line 16 is terminated at each end by a matched (or characteristic) impedance, here by resistors $R_1$, $R_2$. A transistor $18_1$ has its collector electrode and emitter electrode connected to a different terminal of resistor $R_1$. A similar arrangement is shown for resistor $R_2$ and transistor $18_2$. For reasons to become apparent, each one of the transistors $18_1$, $18_2$ is biased in an inverted mode of operation. When a transistor is so biased, current flows into the emitter electrode and out of the collector electrode for an NPN transistor (and vice versa for a PNP transistor). The base electrode of each one of the transistors $18_1$, $18_2$ is coupled to a +V voltage source through a different resistor, not numbered.

In operation if, say, digital data in a modular subsystem is to be transferred via input/output device $14_1$ to another modular subsystem, via input/output device $14n$, a transmit enable signal is applied to transmit enable line $T_1$ and a receive enable signal is applied to receive enable line $R_n$ by controller 12. Therefore, digital data on transmit data line $TD_1$ passes through AND gate $20_1$, driver circuit $22_1$, transmission line 16, AND gate $24n$ and receive data line $RD_n$ to the modular subassembly connected to input/output device $14_n$. In this normal mode of operation the signal on each one of lines $FM_1 - FM_n$ is a binary "0".

Figure 2:
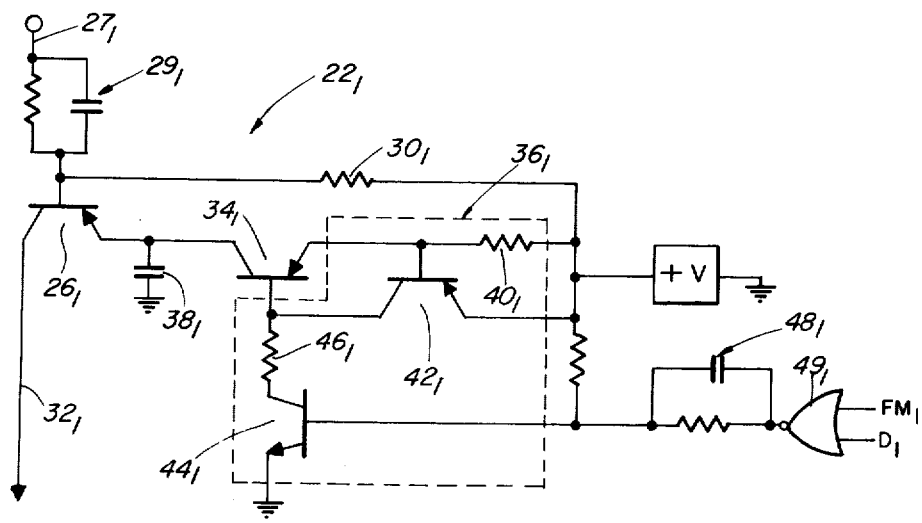
FIG. 2 is a schematic diagram of a driver circuit for use in the digital data transmission system shown in FIG. 1.

Referring now to FIG. 2 an exemplary one of the driver circuits $22_1 - 22_n$, say $22_1$, is shown to include an output transistor $26_1$. The base electrode of such output transistor $26_1$ is in circuit with: the AND gate $20_1$ (FIG. 1) (by line $27_1$ through a conventional R-C coupling network $29_1$, as shown); and a +V voltage source through a resistor $30_1$. The collector electrode of output transistor $26_1$ is connected to transmission line 16 and AND gate $24_1$ (FIG. 1) via line $32_1$. The emitter electrode of output transistor $26_1$ is connected to: the +V voltage source through a drive transistor $34_1$ and a biasing network $36_1$; and a capacitor $38_1$. The driver circuit $22_1$ may therefore be viewed as two electrical circuits intercoupled through capacitor $38_1$. One such electrical circuit includes capacitor $38_1$, output transistor $26_1$ and a "load," such "load" including the transmission line 16 (and its matching resistors $R_1$, $R_2$ and transistors $18_1$, $18_2$ and the input/output devices $14_1 - 14_n$ coupled to such transmission line 16. The other such electrical circuit includes the capacitor $38_1$, drive transistor $34_1$, biasing network $36_1$ and +V voltage source. Biasing network $36_1$ includes: a resistor $40_1$, between the emitter electrode of drive transistor $34_1$ and the +V voltage source; a transistor $42_1$, the base electrode thereof being connected to the emitter electrode of drive transistor $34_1$, the collector electrode thereof being connected to the base electrode of drive transistor $34_1$ and the emitter electrode of transistor $42_1$ being connected to the +V voltage source; and a transistor $44_1$, the emitter electrode thereof being connected to ground (and therefore to the +V voltage source ground), the collector electrode thereof being coupled to the base electrode of drive transistor $34_1$ through resistor $46_1$, and the base electrode thereof being coupled to controller 12 (FIG. 1) via failure monitor line $FM_1$ through conventional R-C coupling network $48_1$ and NOR gate $49_1$.

In operation, when the +V voltage source is activated (output transistor $26_1$ being assumed "off" because a binary "1" signal is applied to line $27_1$), biasing network $36_1$, being arranged to forward bias drive transistor $34_1$, enables current to flow from such source, through resistor $40_1$ and the emitter-base electrodes of drive transistor $34_1$ to (1) resistor $46_1$, transistor $44_1$ (which is assumed to be "on" because the signal on line $FM_1$ is a binary "0" and the +V voltage source; and, (2) capacitor $38_1$, such capacitor therefore charging towards a voltage, $V - V_{CE_{SAT}} \approx V$. When a binary signal "0" is applied to line $27_1$, output transistor $26_1$ turns "on", capacitor $38_1$ discharges through such output transistor $26_1$ and such capacitor $38_1$ thereby provides the initial current to develop a binary "1" signal on the transmission line 16. The current to such transmission line is sustained by current flowing to such line from the +V voltage source through the collector electrode of drive transistor $34_1$. A little thought will make it apparent therefore that capacitor $38_1$ acts as an energy source for output transistor $26_1$, and such transistor's initial "turning on" is not dependent on the inherent delay in having collector current produced in drive transistor $34_1$. That is, no delay is introduced by drive transistor $34_1$. Further, capacitor $38_1$ acts to remove base-emitter storage charge when output transistor $26_1$ is turned "off" by the binary signal "1" on line $27_1$. That is, capacitor $38_1$ charges when output transistor $26_1$ is "off" (such charge being from the +V voltage source and carriers in the base - emitter region of output transistor $26_1$) and discharges when output transistor $26_1$ is "on," such discharge being through such output transistor to the "load."

Let us now consider the condition where output transistor $26_1$ is "on" and current flows, as previously described, from +V voltage source through resistor $40_1$ to drive transistor $34_1$. This is the normal operating condition when driver circuit $22_1$ applies a binary "1" to transmission line 16 (that is, the +V voltage source is coupled to such transmission line). If, for some reason, a short circuit develops across transmission line 16 an excessive amount of current will tend to flow through output transistor $26_1$. The current flow through such output transistor $26_1$ is limited because any "excessive" current flow will cause an increase in the normal voltage developed across resistor $40_1$. Such increase in voltage will provide a forward bias across the base - emitter region of transistor $42_1$, turning such transistor on. Therefore, the base electrode of drive transistor $34_1$ has applied thereto a higher positive voltage than the voltage applied to the emitter electrode of such drive transistor, thereby reducing the current flow through the output transistor to the load. The maximum current which may be supplied to the load under this condition is $\approx 0.6V/R_3$ where $R_3$ is the resistance of resistor $40_1$.

It should here be noted that if a short circuit develops across the collector - emitter region of output transistor $26_1$, a binary "1" will be applied continuously to transmission line 16 (FIG. 1) independent of the signal on line $27_1$. This is because the input/output devices $14_1 - 14_n$ are connected to such transmission line in what is commonly called a "wired - OR" arrangement. Such transistor failure therefore results in an erroneous signal being produced on transmission line 16. When such transistor failure is suspected, or at any other convenient time, a test signal is applied to controller 12 in any convenient manner. Controller 12, in response to such test signal, disables lines $T_1 - T_n$ and $R_1 - R_n$ and produces an enabling signal (i.e. a binary "1") on line $FM_1, FM_2 \ldots FM_n$ consecutively, at mutually exclusive times. Such enabling signals may be produced by conventional logic circuitry arranged with a shift register. The test signal also causes controller 12 to generate a signal on line R to reset flip-flops $50_1 - 50_n$, thereby producing a binary "0" on lines $D_1 - D_n$. The enabling signal on an exemplary failure monitoring line $FM_1$, (and referring also to FIG. 2), turns "off" transistor $44_1$, thereby decoupling the +V voltage source from line $32_1$ in the event that output transistor $26_1$ has a short circuit across its emitter - collector region. That is, such enabling signal on exemplary failure monitoring line $FM_1$ will electrically decouple the driver circuit $22_1$ from the transmission line 16. A little thought will make it apparent that each one of the other driver circuits $22_2 - 22_n$ will successively be decoupled from such line 16. Indicator 52 (FIG. 1) is connected to transmission line 16 and lines $FM_1 - FM_n$. Such indicator provides an indication of which input/output device $14_1 - 14_n$ is short circuited. Thus, indicator 52 here includes a lamp means, $54_1 - 54_n$, each one thereof connected to a different AND gate $56_1 - 56_n$ respectively. AND gates $56_1 - 56_n$ are coupled to transmission line 16 through an inverter, $57_1 - 57_n$ and to failure monitoring lines $FM_1 - FM_n$ respectively. Therefore, in this test mode of operation when the enabling signal on an exemplary line, say $FM_1$, is applied to the AND gate $56_1$ and if such enabling signal removes the faulty binary "1" from transmission line 16, (and therefore a binary "0" now appears on such line) the lamp means $54_1$ connected to such AND gate $56_1$ is activated, thereby indicating that input/output device $14_1$ is faulty. (If such enabling signal does not remove the faulty binary "1" from the line, the lamp means is not activated.) Further, the flip-flop $50_1$ which is connected to such AND gate $56_1$ changes state when the lamp means becomes activated, such flip-flop producing a binary "1" signal on the disabling line $D_1$ thereby disconnecting the faulty input/output device $14_1$ from the system. Such disconnection results because a binary "1" signal on, say line $D_1$, assuming input/output device $14_1$ is faulty, is fed to NOR gate $49_1$ (FIG. 2) thereby turning "off" transistor $44_1$. When the test signal is removed from controller 12, the faulty input/output device will remain decoupled from the transmission line because of the binary "1" signal on line $D_1$.

Let us now consider the terminating arrangement at each end of transmission line 16 as shown in FIG. 1. As previously mentioned, at each end a matching resistor $R_1$, $R_2$ is shunted by a transistor $18_1$, $18_2$, each such transistor being biased in the inverted mode of operation. This terminating arrangement is to provide noise immunity for the system. When a transistor is biased in this mode of operation, a very low (typically 40 mv) emitter to collector saturation voltage is developed. Further, the inverted beta of a transistor so biased (that is, the ratio of emitter current to base current) is generally less than the normal beta (that is the ratio of collector current to base current) by a factor of 10 or more. Let us first consider the case when a binary "0" is applied to transmission line 16 by one of the input/output devices $14_1 - 14_n$. Current will flow from the voltage source (not shown) connected to AND gates $24_1 - 24_n$ through the matching resistors $R_1$, $R_2$ to ground and also through the transistors $18_1$, $18_2$ to ground. Using conventional AND gates $24_1 - 24_n$, a conventional voltage source of +5 volts, and a matching resistor of 50 ohms for resistor $R_1$ and resistor $R_2$, the amount of current flow to ground will be about 16 ma. The major portion of such current will flow through the transistors $18_1$, $18_2$ and not through the resistors $R_1$, $R_2$ and the voltage appearing on transmission line 16 will be limited to about 40 mv, thereby insuring good noise immunity protection for the system. When a binary "1" is applied to the transmission line 16 by one of the input/output devices $14_1 - 14_n$, the activated driver circuit supplies typically 192 ma to such line. Because of the low inverted beta of each transistor $18_1$, $18_2$, however, no more than 16 ma will flow through each one of such transistors. Each 50 ohm matching resistor $R_1$, $R_2$ will pass 80 ma of current, thereby developing a voltage of +4 volts across the transmission line 16. Such voltage is sufficiently large to represent a binary "1" condition. It has been found that a satisfactory ratio of binary "1" current to binary "0" current is one which is greater than 3.

While the salient features have been illustrated and described with respect to the embodiment above, it should now be readily apparent to those of ordinary skill in the art that modifications can be made; for example, when a unidirectional line is used only one matching impedance to such line is needed. Further, only one transistor, say transistor $18_1$, is needed in the bidirectional line described in FIG. 1 even though such line requires two different resistors $18_1$, $18_2$. Further, such transistor $18_1$ may be included in one of the input/output devices.

It is felt, therefore, that this invention should not be restricted to the proposed embodiments, but rather should be limited only by the spirit and scope of the following claims.

What is claimed is:

1. In a digital system, the combination comprising:
   a. a transmission line;
   b. a plurality of input/output devices coupled to such transmission line, each one of such plurality of devices having an output transistor coupled to a voltage supply through a first transistor; and, c. means for inhibiting a flow of current from the voltage source, through the first transistor, to the output transistor, such inhibiting means including an electronic switch coupled to the base electrode of the first transistor of each one of the plurality of input/output devices.

2. In a driver circuit for supplying current from a voltage source to a load selectively in accordance with a binary control signal, such current passing to such load through a current limiting network, the improvement comprising:

a. a capacitor having a first electrode coupled to the current limiting network and a second electrode coupled to the load and the voltage source; and b. switching means having: An input terminal coupled to the first electrode of the capacitor and current limiting network; an output terminal coupled to the load; and a control terminal coupled to a source of the binary control signal, decoupling the capacitor, the current limiting network and the voltage source from the load to enable the capacitor to charge through the current limiting network from the voltage source, and, during a second state of the linear control signal, for coupling the capacitor, the voltage source and the current limiting network to the load to enable current to flow to such load initially from the discharge of the capacitor and thereafter from the source through the current limiting network; and, wherein the current limiting network includes a drive transistor coupled between the first electrode of the capacitor and the voltage source; the switching means includes an output transistor coupled between the load and the first electrode of the capacitor; and, including additionally biasing means for enabling the capacitor to provide a path for discharging minority carriers stored within the output transistor during the first state, such biasing means including: A resistor coupled between the voltage source and an input electrode of the drive transistor; and a current limiting transistor, one electrode thereof being coupled to the input electrode of the drive transistor, and a third electrode thereof being connected to the base electrode of the drive transistor and wherein the biasing means includes an electronic switching means coupled to the base electrode of the drive transistor for providing a control voltage to the base electrode of the drive transistor selectively to turn such drive transistor "on" or "off" in accordance with such control voltage.

* * * * *